(12) United States Patent
Lindert et al.

(10) Patent No.: US 6,946,350 B2
(45) Date of Patent: Sep. 20, 2005

(54) CONTROLLED FACETING OF SOURCE/DRAIN REGIONS

(75) Inventors: Nick Lindert, Beaverton, OR (US); Justin K. Brask, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/750,158

(22) Filed: Dec. 31, 2003

(65) Prior Publication Data

US 2005/0142768 A1   Jun. 30, 2005

(51) Int. Cl.[7] .......................................... H01L 21/336
(52) U.S. Cl. ..................................... 438/285; 438/752
(58) Field of Search ............................... 438/257, 268, 438/285, 300, 517, 752, 972

(56) References Cited

U.S. PATENT DOCUMENTS

| | | | |
|---|---|---|---|
| 6,235,568 B1 | 5/2001 | Murthy et al. | |
| 6,495,402 B1 * | 12/2002 | Yu et al. | 438/149 |
| 6,599,803 B2 * | 7/2003 | Weon et al. | 438/300 |

* cited by examiner

*Primary Examiner*—Phuc T. Dang
(74) *Attorney, Agent, or Firm*—Blakely, Sokoloff, Taylor and Zafman

(57) ABSTRACT

Numerous embodiments of a method for highly selective faceting of the S/D regions in a CMOS device are described. In one embodiment, source/drain regions are formed on a substrate. The source/drain regions are wet etched to form faceted regions. A silicon germanium layer is formed on the faceted regions of the source/drain regions to yield a strained device.

12 Claims, 6 Drawing Sheets tetramethyl ammonium
hydroxide (TMAH)

ammonium hydroxide

CONTROLLED FACETING OF SOURCE/DRAIN REGIONS

TECHNICAL FIELD

Embodiments of this invention relate to the field of semiconductor processing and the fabrication of integrated circuits. In particular, embodiments of the present invention provide a method for MOS device fabrication.

BACKGROUND

Millions of individual transistors are coupled together to form very large-scale integrated (VLSI) circuits, such as microprocessors, memories, and application specific integrated circuits (IC's). Presently, the most advanced IC's are made up of approximately millions of transistors, such as metal oxide semiconductor (MOS) field effect transistors. In order to continue to increase the complexity and computational power of future integrated circuits, more transistors must be packed into a single IC (i.e., transistor density must increase). Unfortunately, the structure and method of fabrication of conventional MOS transistors cannot be simply "scaled down" to produce smaller transistors for higher density integration.

The structure of a conventional MOS transistor 100 is shown in FIG. 1. Transistor 100 comprises a gate electrode 102, typically polysilicon, formed on a gate dielectric layer 104 which in turn is formed on a silicon (Si) substrate 106. A pair of source/drain extensions or tip regions 110 are formed in the top surface of substrate 106 in alignment with outside edges of gate electrode 102. Tip regions 110 are typically formed by well-known ion implantation techniques and extend beneath gate electrode 102. Formed adjacent to opposite sides of gate electrode 102 and over tip regions 110 are a pair of sidewall spacers 108. A pair of source/drain contact regions 120 are then formed, by ion implantation, in substrate 106 substantially in alignment with the outside edges of sidewall spacers 108.

In complementary metal oxide semiconductor (CMOS) fabrication, the silicon based substrate may be replaced to produce a "strained" transistor. Strained Si technology enables improvements in CMOS performance and functionality via replacement of the bulk, cubic-crystal Si substrate with a Si substrate that contains a tetragonally distorted, biaxially strained Si thin layer at the surface. Due to changes in its crystalline structure (i.e. its symmetry is different due to its strain state), the strained Si layer has electronic properties that may be superior to those of bulk Si. Specifically, the strained Si layer has greater electron and hole mobilities, which translate into greater drive current capabilities for CMOS transistors. Growing a Si layer on a silicon germanium (SiGe) layer, which has a larger lattice constant than Si, generates the strained Si heterostructure. The amount of strain that may be imparted on the Si layer is determined by the amount of Ge content in the underlying SiGe layer. Inconsistencies in the SiGe layer may result in variations in the strain imposed by SiGe growth. For example, a substrate region that is etched for SiGe growth may possess significant variability and be isotropic in nature.

BRIEF DESCRIPTION OF THE DRAWINGS

Embodiments of the present invention are illustrated by way of example, and not limitation, in the figures of the accompanying drawings in which.

DETAILED DESCRIPTION

In the following description, numerous specific details are set forth such as examples of specific materials or components in order to provide a thorough understanding of embodiments of the present invention. It will be apparent, however, to one skilled in the art that these specific details need not be employed to practice embodiments of the present invention. In other instances, well known components or methods have not been described in detail in order to avoid unnecessarily obscuring embodiments of the present invention.

The terms "on," "above," "below," "between," and "adjacent" as used herein refer to a relative position of one layer or element with respect to other layers or elements. As such, a first element disposed on, above or below another element may be directly in contact with the first element or may have one or more intervening elements. Moreover, one element disposed next to or adjacent another element may be directly in contact with the first element or may have one or more intervening elements.

Any reference in the specification to "one embodiment" or "an embodiment" means that a particular feature, structure, or characteristic described in connection with the embodiment is included in at least one embodiment of the claimed subject matter. The appearances of the phrase, "in one embodiment" in various places in the specification are not necessarily all referring to the same embodiment.

Embodiments of a method for selective, facet etching of source/drain (S/D) regions are described. In one method of the present invention, the S/D regions of a complementary metal oxide semiconductor (CMOS) may undergo a highly selective faceting wet etch. The faceted regions may then be deposited with epitaxial silicon germanium (epi-SiGe) to yield a strained device. The wet etching method to produce the faceted regions is highly controlled and selective, thereby reducing S/D etch variation.

Figure 1:
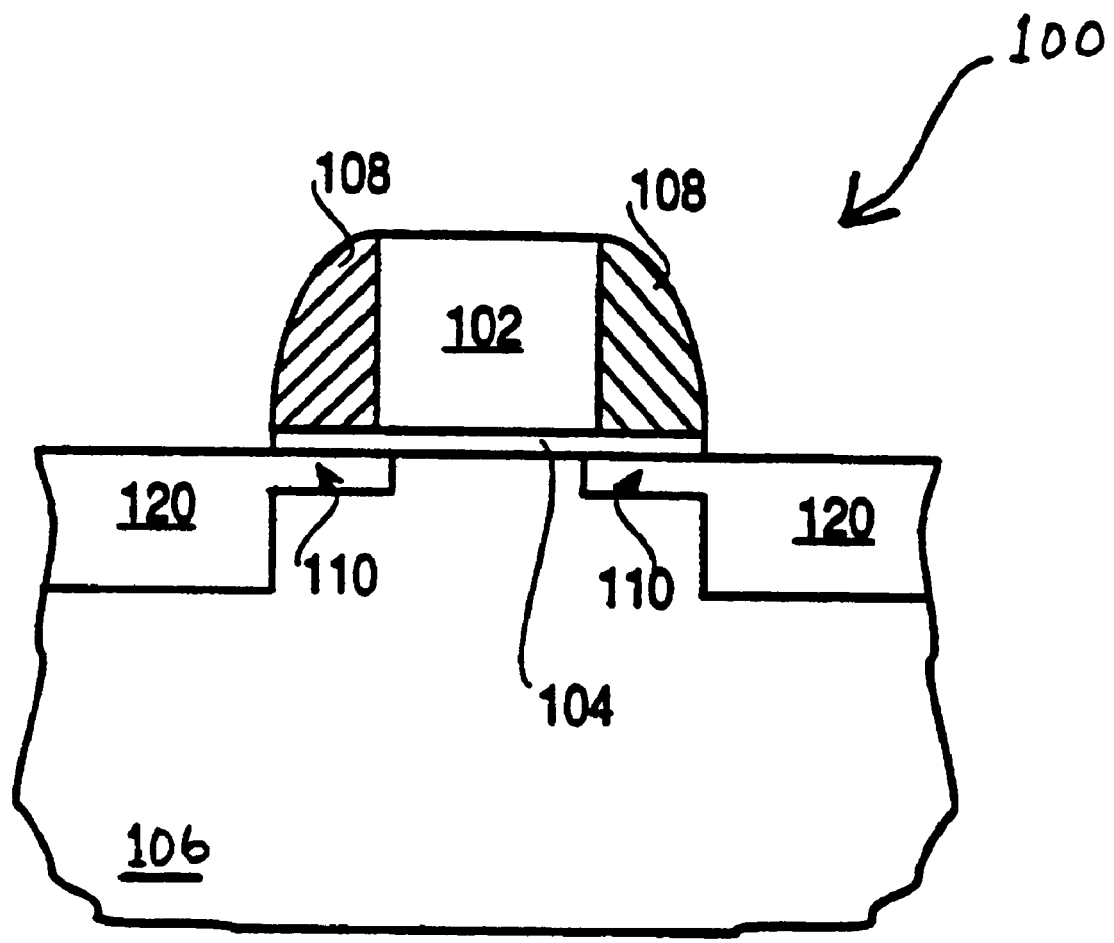
FIG. 1 illustrates a conventional MOS transistor.
Figure 2A:
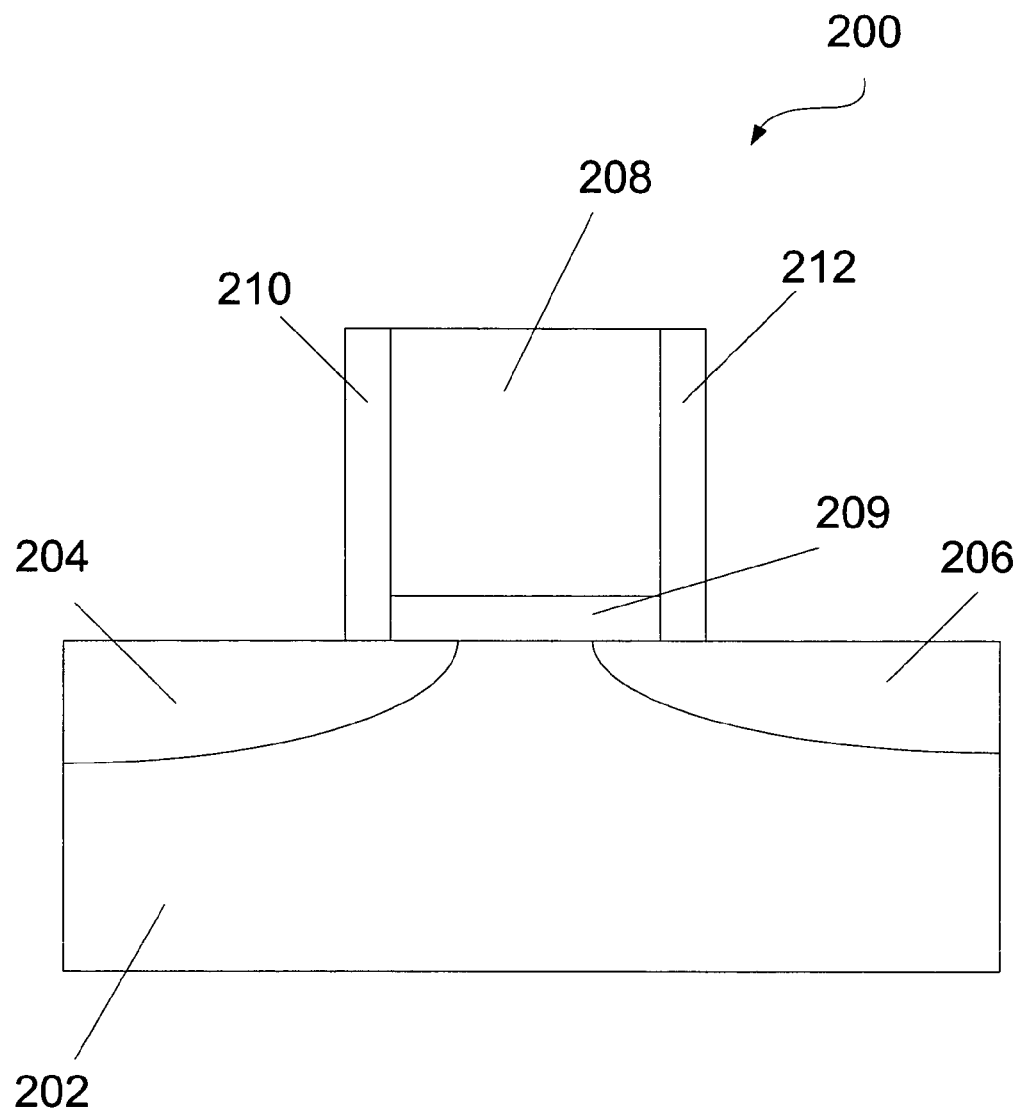
FIGS. 2A–2C illustrate one method for the controlled faceting of S/D regions of a CMOS device.
Figure 2B:
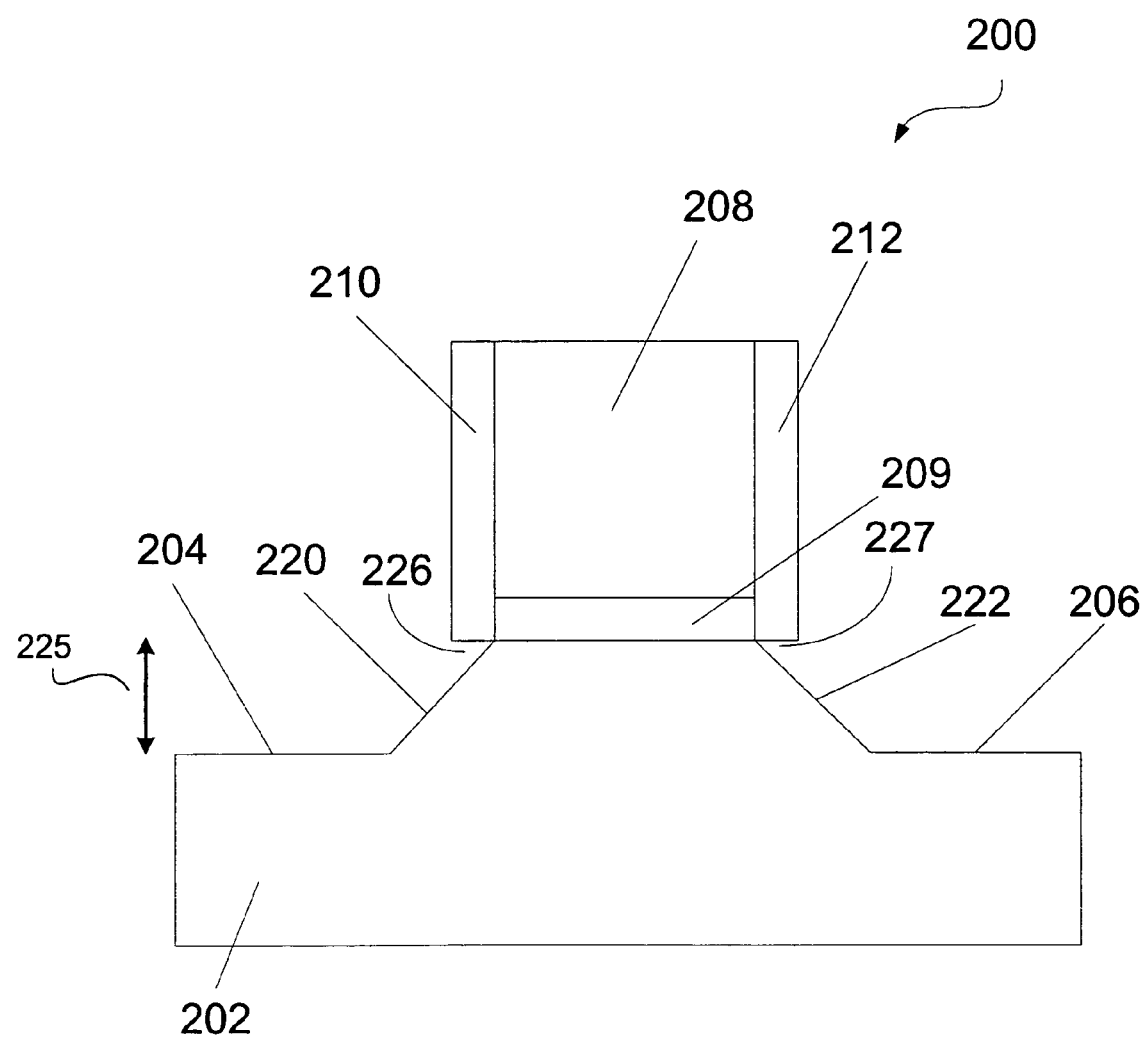
Figure 2C:
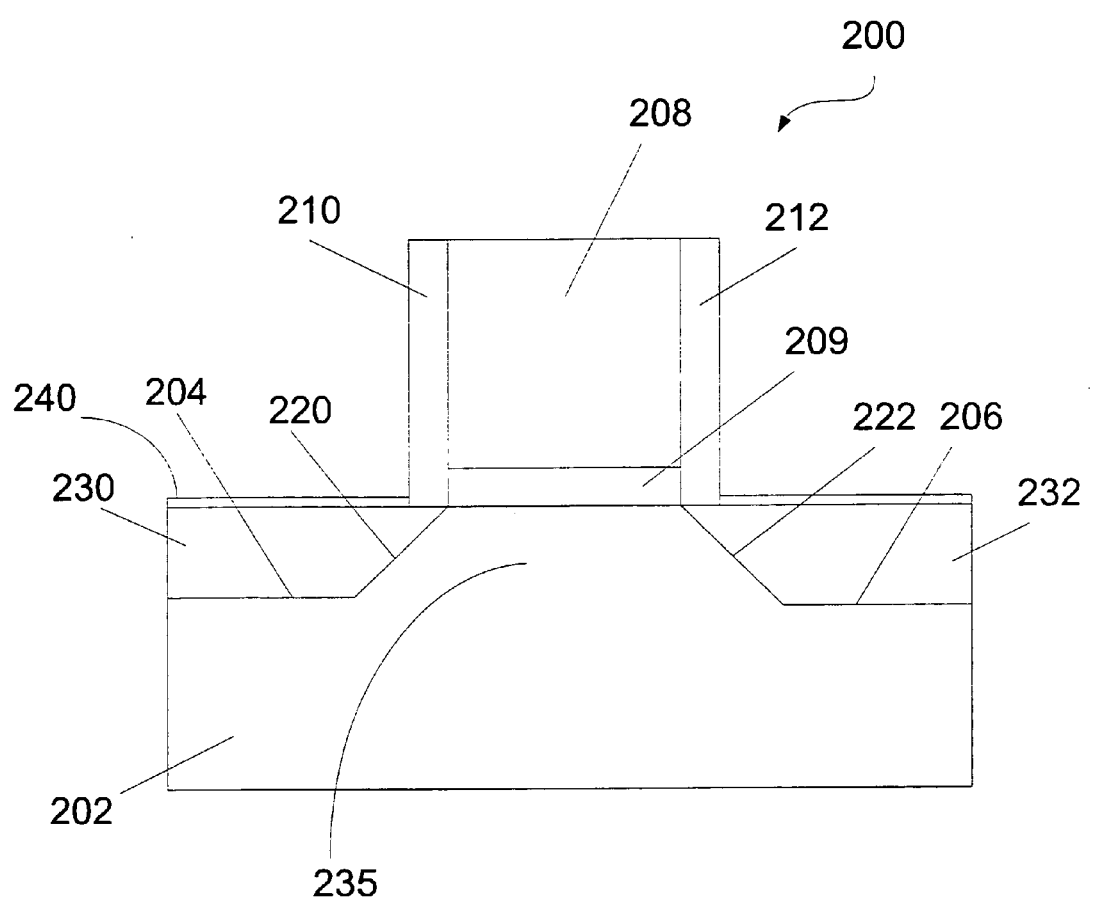

FIGS. 2A–2C illustrate one method for the controlled faceting of S/D regions of a CMOS device. As described in greater detail below, the faceted regions may be filled with epitaxial SiGe to yield a strained device. The method described herein provides the advantage of reducing S/D etch variation with a high level of control and consistent etch depth. Although embodiments of the present invention are described with respect to CMOS devices, one skilled in the art will appreciate the ability to use aspects of embodiments of the present invention to form just negative-channel metal oxide semiconductor (nMOS) devices or positive-channel metal oxide semiconductor (PMOS) devices such as bipolar devices.

FIG. 2A illustrates a CMOS transistor 200 before undergoing an etching process to produce a strained device. Gate electrode 208 has been formed by forming a gate dielectric layer 209 on silicon substrate 202. A conducting layer of aluminum or polysilicon may be deposited on the gate dielectric layer 209. The conducting layer is then anisotropically etched selectively to the gate dielectric layer 209 to define gate electrode 208 stacked above gate dielectric layer 209. Gate dielectric layer 209 may be a nitrided oxide layer formed to a thickness of between about 10 Angstroms to about 50 Angstroms. It may be appreciated that other well known gate dielectric layers such as oxides, nitrides, and combinations thereof may be utilized if desired. Gate electrode 208 may be formed from about 800 Angstroms to about 3500 Angstroms thick layer of polysilicon patterned into the gate electrode with well known photolithographic techniques. If desired, the polysilicon layer can be ion implanted to the desired conductivity type and level prior to patterning.

Following formation of the gate electrode 208, source/drain regions 204, 206 are formed, usually by implanting a dopant species into substrate 202. Gate electrode 208 may serve as a hard mask against the implant so that the source/drain regions 204, 206 are formed by self-aligning in substrate 202 to the gate electrode 208. Substrate 202 may then be annealed to activate the dopant in the source/drain regions 204, 206. Sidewall spacers 210, 212 may also be implanted above source/drain regions 204, 206. In one embodiment, substrate 202 may include p-type conductivity and/or n-type conductivity.

A substrate may be defined as the starting material on which transistors described herein are fabricated. Substrate 202 may also be any surface, generated when making an integrated circuit, upon which a conductive layer may be formed. Substrate 202 thus may include, for example, active and passive devices that are formed on a silicon wafer such as transistors, capacitors, resistors, diffused junctions, gate electrodes, local interconnects, etc. Substrate 202 also may include insulating materials (e.g., silicon dioxide, either undoped or doped with phosphorus or boron and phosphorus, silicon nitride, silicon oxynitride, or a polymer) that separate such active and passive devices from the conductive layer or layers that are formed above them, and may include previously formed conductive layers.

FIG. 2B illustrates CMOS transistor 200 after undergoing a controlled etch of substrate 202 and source/drain regions 204, 206 to form facets 220, 222. In one embodiment, substrate 202 and source/drain regions 204, 206 are etched using a wet etch chemistry. Wet etch chemistry involves a corrosive in a solution used to etch the target substrate. Silicon based substrates may be etched with a chemistry having a variety of conditions (e.g., temperature, pH, concentrations, etc.). In one embodiment, the faceted wet etch of substrate 202 and/or source/drain regions 204, 206 may be an anisotropic process that is controlled by utilizing a high pH, nucleophilic etch which may be dictated by the crystal density and/or crystal orientation (e.g., the orientation of the substrate surface to the crystal planes) of the silicon-based substrate 202, allowing for controlled faceting to a desired depth and with minimal variation.

Figure 3:
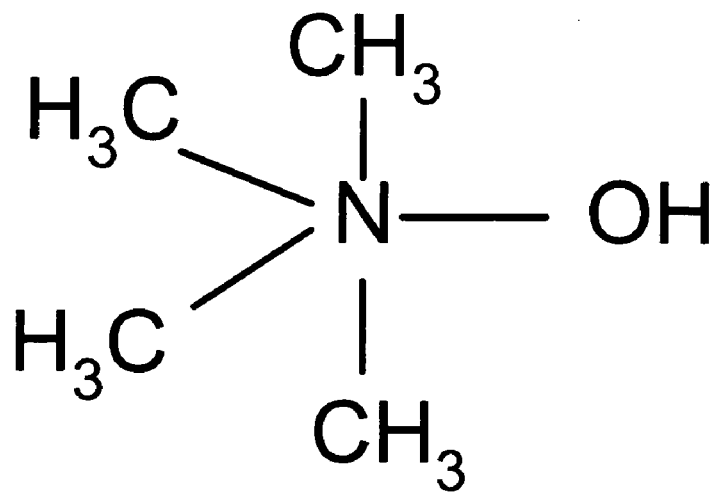
FIG. 3 illustrates the Lewis structures of tetra methyl ammonium hydroxide and ammonium hydroxide.
Figure 3:
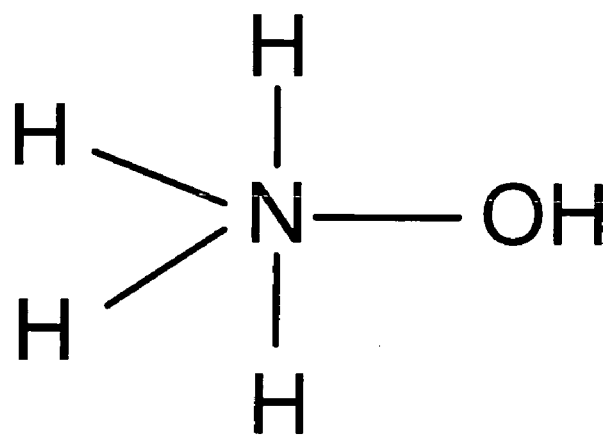

In one embodiment, as part of the wet etch chemistry to form facets 220, 222, an aqueous tetra methyl ammonium hydroxide (TMAH) solution in the concentration range of about 10 percent to about 30 percent by volume and in the temperature range of about 20° C. to about 45° C. may be used together with sonication. The sonication may be provided by a transducer that dissipates ultra or megasonic energy with a power of about 0.5 to 5 watts per $cm^2$ in one embodiment of the present invention. In one embodiment, an about 25 percent TMAH solution by volume may be used. In another embodiment, a pH of about 9 to about 11 aqueous ammonium hydroxide ($NH_4OH$) solution in the concentration range of about 2 to about 30 percent by volume and in the temperature range of about 15° C. to about 60° C. may be used together with sonication. The sonication may be provided by a transducer that dissipates ultra or megasonic energy with a power of about 0.5 to about 5 watts per $cm^2$ in one embodiment of the present invention. In one embodiment, an about 15 percent ammonium hydroxide solution by volume may be used. The Lewis structures of TMAH and ammonium hydroxide are illustrated in FIG. 3.

The faceting wet etch may be selective to oxides and nitrides and therefore etch the exposed (i.e., desired) portions of the silicon-based substrate 202 and/or source/drain regions 204, 206. Gate electrode 208 may act as a mask such that etching occurs on both sides gate electrode 208 to produce the etch-out shape illustrated in FIG. 2B. In one embodiment, the wet etch chemistry produces facets with facet angles in the range of about 50 degrees to about 60 degrees. The etch-out angles of facet regions 220, 222 may be in the range of about 120 degrees to about 130 degrees. In one particular embodiment of the present invention, the etch-out angles of facet regions 220, 222 may be about 125 degrees. The etch depth 225 of the source/drain regions 204, 206 and/or substrate 202 may be about 100 Angstroms to about 500 Angstroms and is consistent relative to both sides of gate electrode 208. In one particular embodiment of the present invention, etch depth 225 may be about 200 Angstroms. Substrate 202 may have about a (100) crystal orientation in the Z-direction and source/drain regions 204, 206 may have about (110) or (111) crystal orientation. Moreover, the extent of undercut regions 226, 227 formed by the controlled faceting wet etch may be varied as required.

In one embodiment of the present invention, prior to etching source/drain regions 204, 206, a patterned photoresist layer (not shown) may be disposed above source/drain regions 204, 206. Well-known methods and materials are used to form patterned the photoresist layer. The photoresist layer may be patterned in such a way that a first portion of source/drain regions 204, 206 are covered with photoresist, and a second portion of source/drain regions 204, 206 are exposed. Although the photoresist layer may be disposed such that it is in direct contact with source/drain regions 204, 206, those skilled in the art will recognize that there could be one or more other layers disposed between source/drain regions 204, 206 and the overlying photoresist layer. If a photoresist is used, conventional post-etch cleaning techniques may be used to remove the photoresist layer (e.g., dissolve in sulfuric acid) that results in the etch-out shape illustrated in FIG. 2B. The photoresist layer may be removed prior to or after the faceting wet etch method discussed above.

In an alternative embodiment, the photoresist layer may be used to facet wet etch one type of transistor relative to another type (e.g., p-type versus n-type). For example, to facet by wet etch of p-type transistors and not n-type transistors, a photoresist layer (e.g., silicon dioxide) may be disposed above the n-type regions.

FIG. 2C illustrates CMOS transistor 200 as a strained device with faceted regions 220, 222 filled with silicon germanium (SiGe) layers 230, 232 through epitaxial growth. As discussed above, facets 220, 222 are formed with consistent depth and angles. The little or no variation provided by the faceted wet etch allows for a consistent strain imposed by the epi-SiGe growth. SiGe layers 230, 232 may be a sequence of layers that have a gradually increasing germanium content up to a final germanium composition. The germanium composition may be about 10 percent to about 60 percent. In one particular embodiment of the present invention, the germanium composition may be about 25 percent. Any one of a number of techniques may be used for epi-SiGe growth, including but not limited to vapor-phase epitaxy (VPE), liquid-phase epitaxy (LPE), and solid-phase epitaxy (SPE). Epitaxial growth techniques are known in the art; accordingly, a detailed discussion is not provided herein.

After the growth of SiGe layers 230, 232, a layer of silicon 240 may be deposited above SiGe layers 230, 232. By depositing silicon layer 240 above SiGe layers 230, 232, which has a larger lattice constant than silicon layer 240, a strained silicon heterostructure may be generated. In addition to invoking strain on silicon layer 240, SiGe layers 230, 232 also invoke strain on channel silicon region 235 (i.e., the region below gate electrode 208). This aspect may be important in pMOS devices where a compressive strain is invoked because a tensile strain within the SiGe lattice relative to plain silicon. In other words, SiGe layers 230, 232 "squeeze" channel silicon region 235 on either side. As such, the precise and consistent etch depth (e.g., depth 225) provided by the embodiments of the faceting wet etch described herein allow for effective straining of a CMOS device.

Figure 4:
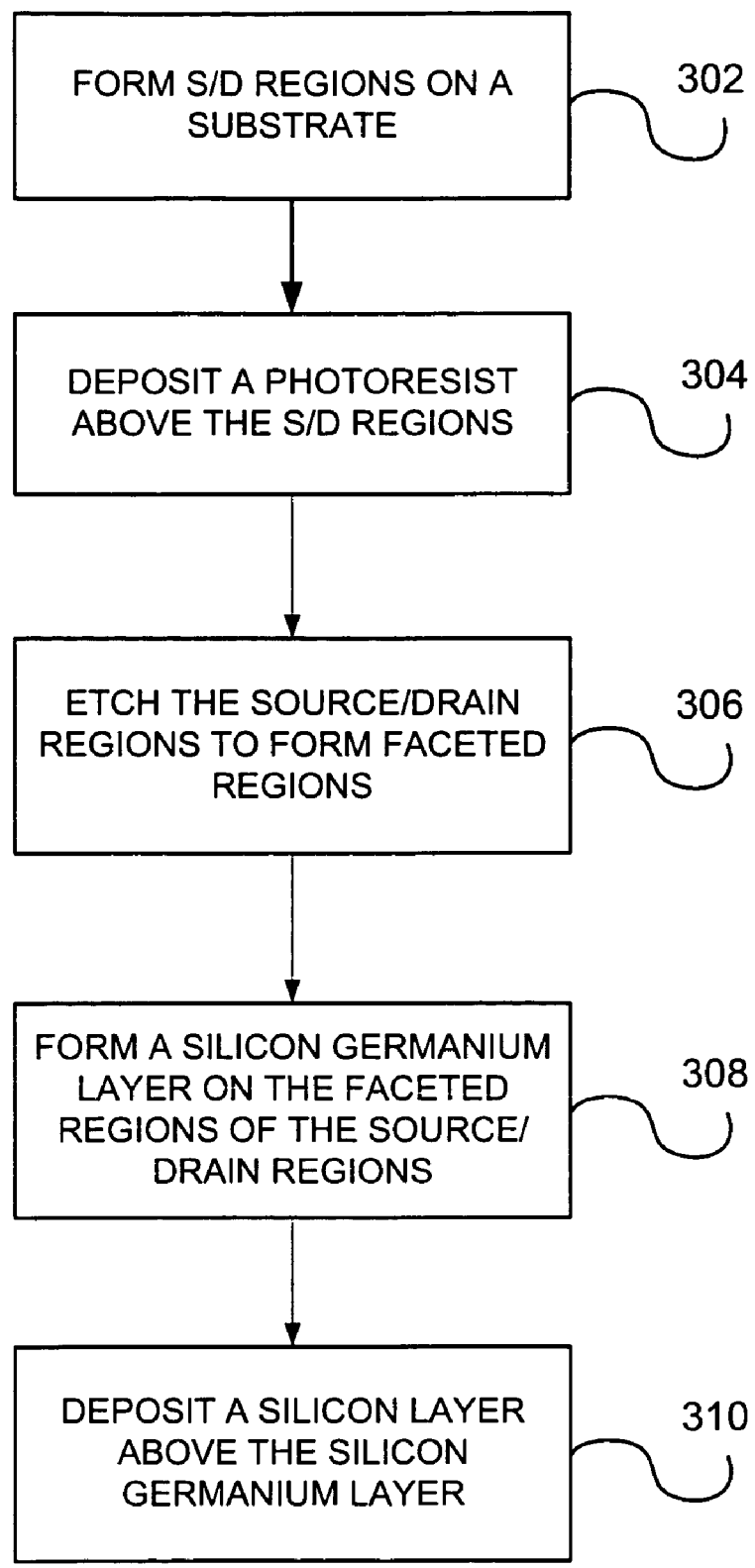
FIG. 4 illustrates a flow chart of one method for the controlled faceting of S/D regions of a CMOS device and subsequent layering of epi-SiGe.

FIG. 4 illustrates one method for the controlled faceting of S/D regions of a CMOS device and subsequent layering of epi-SiGe to produce a strained device. Source/drain regions (e.g., source/drain regions 204, 206) are initially formed on a substrate, block 302. For example, dopant species may be implanted into the substrate to form the source/drain regions. The substrate may, in one embodiment, be part of a CMOS transistor (e.g., substrate 202 of transistor 200). A gate electrode (e.g., 208) may also be formed above the source/drain regions and may include a gate dielectric layer (e.g., 209) and sidewall spacers (e.g., 210, 212). Optionally, a patterned photoresist layer may then be disposed above the source/drain regions, block 304, followed by an etch chemistry to form faceted regions (e.g., 220, 222) in the substrate and source/drain regions, block 306. In one embodiment, an anisotropic wet etch chemistry that utilizes a high pH, nucleophilic etch that may be dictated by the crystal density and/or crystal orientation of the substrate may be used to form the faceted regions. For example, solutions of tetra methyl ammonium hydroxide or ammonium hydroxide may be used to form the faceted regions. This highly selective faceting wet etch allows for controlled faceting of the source/drain regions to a desired depth and with minimal variation. The faceting wet etch may remove all or a portion of the source/drain regions.

The faceted regions may then be layered with SiGe, block 308. In one embodiment, the faceted regions may be filled with SiGe layers through epitaxial growth. The SiGe layers may be a sequence of layers that have a gradually increasing germanium content up to a final germanium composition. Any one of a number of techniques may be used for epi-SiGe growth, including but not limited to VPE, LPE, and SPE. After the growth of the SiGe layers, a layer of silicon may be deposited above SiGe layers, block 310. By depositing silicon above the SiGe layers, which has a larger lattice constant than the silicon, a consistent, strained silicon heterostructure may be generated.

In the foregoing specification, the invention has been described with reference to specific exemplary embodiments thereof. It will, however, be evident that various modifications and changes may be made thereto without departing from the broader spirit and scope of embodiments of the invention as set forth in the appended claims. The specification and figures are, accordingly, to be regarded in an illustrative rather than a restrictive sense.

What is claimed is:

1. A method, comprising:
   forming source/drain regions on a substrate;
   etching the source/drain regions to form faceted regions;
   forming a silicon germanium layer on the faceted regions of the source/drain regions; and
   depositing a silicon layer above the silicon germanium layer to form a strained device, wherein anisotropic wet etching allows for controlled faceting of the source/drain regions based on a crystal density and a crystal orientation of the source/drain regions.

2. A method, comprising:
   forming source/drain regions on a substrate;
   anisotropic wet-etching the source/drain regions to form faceted regions;
   forming a silicon germanium layer on the faceted regions of the source/drain regions,
   wherein the faceted regions have an etch-out angle of about 120 degrees to about 130 degrees.

3. A method, comprising:
   wet etching a source/drain region of a substrate with an etch solution having about 2 percent to about 30 percent ammonium hydroxide by volume;
   forming a facet region in the source/drain region;
   layering the facet region with silicon germanium; and
   depositing silicon above silicon germanium.

4. The method of claim 3, wherein the etch solution has a pH of about 9 to about 11.

5. The method of claim 4, wherein the etch solution has a temperature of about 15° C. to about 60° C.

6. A method, comprising:
   wet etching a source/drain region of a substrate with an etch solution having about 10 percent to about 30 percent tetra methyl ammonium by volume;
   forming a facet region in the source/drain region;
   layering the facet region with silicon germanium; and
   depositing silicon above silicon germanium.

7. The method of claim 6, wherein the etch solution has a temperature of about 20° C. to about 45° C.

8. A method, comprising:
   wet etching a source/drain region of a substrate to an etch depth of about 100 Angstroms to about 500 Angstroms;
   forming a facet region in the source/drain region;
   layering the facet region with silicon germanium; and
   depositing silicon above silicon germanium.

9. The method of claim 3, wherein the etch solution is based on a crystal density and a crystal orientation of the substrate.

10. The method of claim 6, wherein the etch solution is based on a crystal density and a crystal orientation of the substrate.

11. The method of claim 6, wherein wet etching further comprises sonicating the wet etch solution.

12. A method, comprising:
   providing a substrate having a source/drain region, a gate electrode disposed above the substrate, and a channel region formed below the gate electrode;
   etching the source/drain region to form a faceted region near the channel region with an etch solution of about 10 percent to about 30 percent tetra methyl ammonium hydroxide by volume;
   layering the faceted region with silicon germanium; and
   depositing silicon above the silicon germanium.

\* \* \* \* \*